(12) United States Patent
Erchak et al.

(10) Patent No.: US 8,100,567 B2
(45) Date of Patent: Jan. 24, 2012

(54) LIGHT-EMITTING DEVICES AND RELATED SYSTEMS

(75) Inventors: Alexei A. Erchak, Cambridge, MA (US); Michael Lim, Cambridge, MA (US); Elefterios Lidorikis, Ioannina (GR); Jo A. Venezia, Boston, MA (US); Nikolay I. Nemchuk, North Andover, MA (US); Robert F. Karlicek, Jr., Chelmsford, MA (US)

(73) Assignee: Rambus International Ltd., Grand Cayman (KY)

( * ) Notice: Subject to any disclaimer, the term of this patent is extended or adjusted under 35 U.S.C. 154(b) by 0 days.

(21) Appl. No.: 11/323,176

(22) Filed: Dec. 30, 2005

(65) Prior Publication Data
US 2007/0085082 A1 Apr. 19, 2007

Related U.S. Application Data

(60) Provisional application No. 60/728,344, filed on Oct. 19, 2005, provisional application No. 60/730,771, filed on Oct. 27, 2005.

(51) Int. Cl.
*F21V 29/00* (2006.01)

(52) U.S. Cl. ....... 362/373; 362/294; 361/700; 165/80.4; 165/104.26; 257/715; 257/E33.075; 174/15.2

(58) Field of Classification Search ................. 362/580, 362/547, 218, 264, 267, 345, 373, 600, 609, 362/611, 612, 613, 614, 632, 634; 349/58, 349/65, 67, 70; 257/81.99, E33.075, 98, 257/712, 715; 361/700; 165/80.4, 104.26; 174/15.2

See application file for complete search history.

(56) References Cited

U.S. PATENT DOCUMENTS

| | | | |
|---|---|---|---|
| 5,170,195 | A | 12/1992 | Akiyama et al. |
| 5,628,362 | A | 5/1997 | Rew et al. |
| 5,667,289 | A | 9/1997 | Akahane et al. |
| 5,772,300 | A | 6/1998 | Kitai |
| 5,914,764 | A | 6/1999 | Henderson |
| 6,005,649 | A | 12/1999 | Krusius et al. |
| 6,134,043 | A | 10/2000 | Johnson et al. |
| 6,288,896 | B1 | 9/2001 | Hsu |

(Continued)

FOREIGN PATENT DOCUMENTS

JP 2007-10176 4/2007

(Continued)

OTHER PUBLICATIONS

International Search Report, from PCT/US2006/40149, mailed Jul. 3, 2008.

*Primary Examiner* — John A Ward
(74) *Attorney, Agent, or Firm* — Renner, Otto, Boisselle & Sklar, LLP

(57) ABSTRACT

Light-emitting devices can include a package that supports one or more light-emitting die (e.g., light-emitting diode die, laser diode die) and which can ensure mechanically stability, can facilitate electrical and/or thermal coupling with light-emitting die, and can manipulate the manner by which light generated by the die is emitted out of the light-emitting device. The package can also facilitate the integration of the light-emitting devices in various components and systems. For example, suitable packages may facilitate the use of light-emitting devices in components and systems such as light-emitting panel assemblies, LCD back lighting, general lighting, decorative or display lighting, automotive lighting, and other types of lighting components and systems.

14 Claims, 12 Drawing Sheets

U.S. PATENT DOCUMENTS

| | | |
|---|---|---|
| 6,341,879 B1 | 1/2002 | Skinner et al. |
| 6,357,515 B1 | 3/2002 | Bhatia |
| 6,717,559 B2 | 4/2004 | Weindorf |
| 6,717,813 B1 | 4/2004 | Garner |
| 6,831,302 B2 | 12/2004 | Erchak et al. |
| 6,976,769 B2 | 12/2005 | McCullough et al. |
| 7,095,180 B2 | 8/2006 | Emslie et al. |
| 7,098,486 B2 * | 8/2006 | Chen ................................ 257/99 |
| 7,101,055 B2 | 9/2006 | Hsieh et al. |
| 7,168,842 B2 * | 1/2007 | Chou et al. .................... 362/631 |
| 7,204,615 B2 * | 4/2007 | Arik et al. ...................... 362/294 |
| 7,253,447 B2 * | 8/2007 | Oishi et al. ...................... 257/99 |
| 7,284,874 B2 * | 10/2007 | Jeong et al. .................. 362/97.1 |
| 7,513,651 B2 * | 4/2009 | Chen ............................. 362/294 |
| 2002/0113534 A1 * | 8/2002 | Hayashi et al. ................ 313/113 |
| 2003/0023448 A1 | 1/2003 | Geiger et al. |
| 2003/0072153 A1 | 4/2003 | Matsui et al. |
| 2003/0086454 A1 | 5/2003 | Nagano et al. |
| 2003/0147036 A1 | 8/2003 | Kaise et al. |
| 2004/0075100 A1 | 4/2004 | Bogner et al. |
| 2004/0213016 A1 * | 10/2004 | Rice ................................ 362/547 |
| 2005/0030483 A1 | 2/2005 | Kim |
| 2005/0040424 A1 | 2/2005 | Erchak et al. |
| 2005/0082545 A1 | 4/2005 | Wierer et al. |
| 2005/0174797 A1 | 8/2005 | Chen |
| 2005/0231983 A1 | 10/2005 | Dahm |
| 2005/0276053 A1 | 12/2005 | Nortrup et al. |
| 2006/0002142 A1 | 1/2006 | Jeong et al. |
| 2006/0034085 A1 * | 2/2006 | Wang et al. .................... 362/294 |
| 2006/0092666 A1 | 5/2006 | Jeong et al. |
| 2006/0146561 A1 | 7/2006 | Gu et al. |
| 2006/0181670 A1 | 8/2006 | Kurokawa et al. |
| 2006/0221271 A1 | 10/2006 | Tsai |
| 2006/0221638 A1 | 10/2006 | Chew et al. |
| 2006/0245214 A1 | 11/2006 | Kim |
| 2006/0292461 A1 | 12/2006 | Shives et al. |
| 2007/0045640 A1 | 3/2007 | Erchak et al. |
| 2007/0085082 A1 | 4/2007 | Erchak et al. |
| 2007/0102142 A1 | 5/2007 | Reis et al. |
| 2007/0211182 A1 | 9/2007 | Erchak et al. |
| 2007/0211183 A1 | 9/2007 | Erchak et al. |
| 2011/0121703 A1 | 5/2011 | Karlicek, Jr. et al. |

FOREIGN PATENT DOCUMENTS

| | | | |
|---|---|---|---|
| JP | 2007-101766 | * | 4/2007 |

* cited by examiner

LIGHT-EMITTING DEVICES AND RELATED SYSTEMS

RELATED APPLICATIONS

This application claims priority under 35 U.S.C. §119(e) to U.S. Provisional Application Ser. No. 60/728,344, filed on Oct. 19, 2005, and to U.S. Provisional Application Ser. No. 60/730,771, filed on Oct. 27, 2005, which are herein incorporated by reference in their entirety.

FIELD OF INVENTION

The invention relates generally to light-emitting devices, as well as related components, systems, and methods, and more particularly to light-emitting device packaging and related systems, such as light-emitting panel assemblies.

BACKGROUND

The overall performance of a variety of light-emitting devices, such as light-emitting diodes (LEDs) and laser diodes, can be influenced by both properties at the die and package level. The active components of such light-emitting devices are typically one or more light-emitting die having a semiconductor p-n junction, with possibly one or more quantum wells in the active region of the p-n junction. Although the die within such light-emitting devices are the active elements that generate the light, the package that houses the die can influence both the performance and the ease of use of the light-emitting device in components and systems.

SUMMARY OF INVENTION

The invention provides light-emitting devices, as well as related components, systems, and methods.

In one embodiment, a light-emitting panel assembly comprises a light-emitting device designed to emit light; a heat pipe in contact with the light-emitting device and designed to extract heat from the light-emitting device; and an illumination panel associated with the light-emitting device such that light emitted from the light-emitting device passes therethrough, wherein the light-emitting device is arranged to emit light into an edge of the illumination panel.

In one embodiment, a light-emitting module assembly comprises a first light-emitting device having a first feature; and a second light-emitting device having a second feature, wherein the first feature and the second feature are engaged to connect the first light-emitting device and the second light-emitting device.

In one embodiment, a light-emitting device comprises at least one first feature configured to engage a second feature on a second light-emitting device to connect the first light-emitting device and the second light-emitting device.

In one embodiment, a light-emitting module assembly comprises a first light-emitting device having a first light emission surface; a second light-emitting device have a second light emission surface; and an intermediate component having a first engagement feature and a second engagement feature, wherein the first engagement feature is connected to the first light-emitting device and the second engagement feature is connected to the second light-emitting device to form a rigid assembly.

In one embodiment, a light-emitting panel assembly comprises a light-emitting device designed to emit light; an illumination panel associated with the light-emitting device such that light emitted from the light-emitting device passes therethrough; and a supporting structure constructed and arranged to support the light-emitting device and the illumination panel, wherein the supporting structure is capable of conducting heat generated by the light-emitting device.

Other aspects, embodiments and features of the invention will become apparent from the following detailed description of the invention when considered in conjunction with the accompanying drawings. The accompanying figures are schematic and are not intended to be drawn to scale. In the figures, each identical, or substantially similar component that is illustrated in various figures is represented by a single numeral or notation.

For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

BRIEF DESCRIPTION OF DRAWINGS

FIG. 4b shows a cross-section of the heat spreading component shown in FIG. 4a;

FIG. 11b is a cross-section of the light-emitting panel assembly of FIG. 11a.

DETAILED DESCRIPTION

Light-emitting devices can include a package that supports one or more light-emitting die (e.g., light-emitting diode die, laser diode die) and which can ensure mechanically stability, can facilitate electrical and thermal coupling with the light-emitting die, and can manipulate the manner by which light generated by the die is emitted out of the light-emitting device. The package can also facilitate the integration of the light-emitting devices in various components and systems. As described further below, features of the package may be designed to enhance the overall performance and integration capabilities of light-emitting devices according to different embodiments of the invention. For example, suitable packages may facilitate the use of light-emitting devices in components and systems such as light-emitting panel assemblies, LCD back lighting, general lighting, decorative or display lighting, automotive lighting, and other types of lighting components and systems.

Light-emitting devices including a package having a heat spreading component are provided. The package including the heat spreading component can have partial heat sink capabilities which can be designed to reduce the influence of the thermal resistance of contact interfaces on the total thermal resistance of the light-emitting device. In particular, the package design may be useful for high power light-emitting devices (e.g., light-emitting devices having a total output power of greater than 0.5 Watts). High power devices can benefit from efficient heat removal in order to prevent premature aging and/or breakdown of the device from excessive heating. This is especially true of high power light-emitting devices where junction temperatures can be greater than 120° C. under normal operating conditions. High junction temperatures can cause undesired wavelength shifts in the light emission output as well. A heat sink may be employed to conduct heat away from the active area (i.e., lower the junction temperature) of the light-emitting device and into the surrounding ambient. Typically, conventional high power light-emitting devices have a specially-designed external heat sink wherein complex engineering of the package/heat sink interface minimizes the contact thermal resistance. One aspect of some embodiments of the invention is the removal of the emphasis on this interface so that the light-emitting device can be mounted using standard techniques.

Suitable light-emitting devices, including high power light-emitting devices, used in connection with embodiments of the invention and methods for forming the same have been described in U.S. Pat. No. 6,831,302 which is incorporated herein by reference. Also, suitable light-emitting device packages and methods of forming the same have been described in U.S. patent application Ser. No. 11/210,261, filed Aug. 23, 2005, and U.S. patent application Ser. No. 11/209,957, filed Aug. 23, 2005, both of which are incorporated herein by reference.

Figure 1:
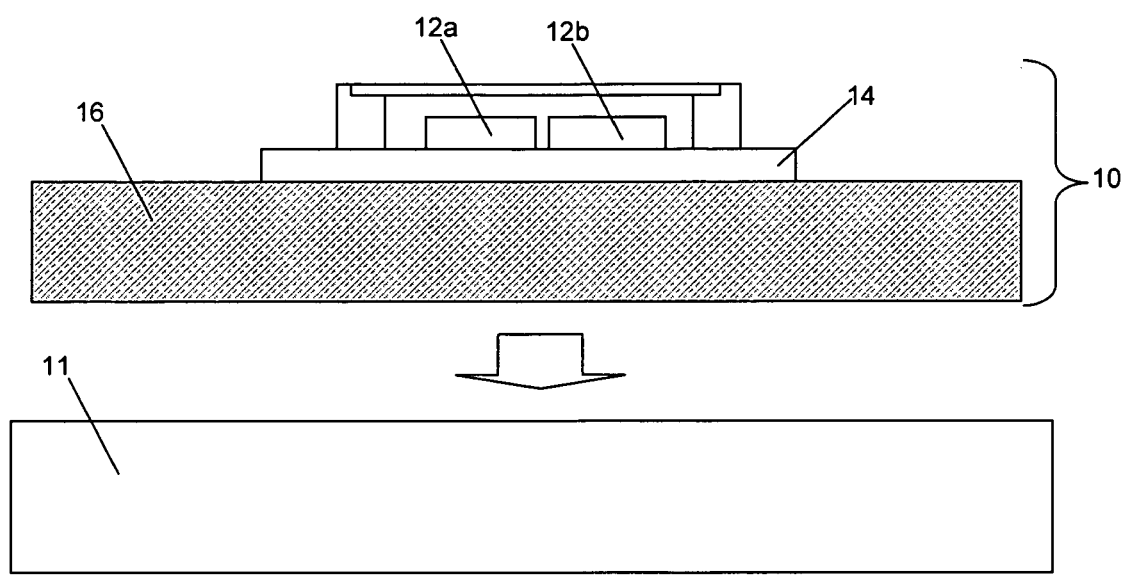
FIG. 1 is a cross-section of a light-emitting device including a heat spreading component that can be thermally coupled to an external heat sink according to one embodiment of the invention.

FIG. 1 shows a light-emitting device 10 including light-emitting die 12a, 12b mounted on a sub-package 14 according to one embodiment of the invention. The light-emitting die 12a and 12b can comprise semiconductor stacks which may be mounted on a submount. The light-emitting device includes a heat spreading component 16 attached to the sub-package, wherein the heat spreading component 16 can in turn be attached to an external heat sink 11. In the illustrated embodiment, the heat spreading component is a plate. The presence of the heat spreading component modifies the contact interfaces (i.e., die/sub-package, sub-package/heat spreading component, heat spreading component/heat sink). The heat spreading component can take the engineering emphasis off the heat sink contact interface, enabling more flexibility in mounting schemes and a larger tolerance for mass-production assembly. Various embodiments of light-emitting devices including a heat spreading component can enable the dissipation of more than 5 W (e.g., more than 10 W, more than 25 W, more than 50 W) of heat from the light-emitting die. The ability to extract such large amounts of heat can facilitate the use of high power light-emitting devices which typically generate significant thermal energy during operation.

In some embodiments, the interface contact area at the heat spreading component/heat sink interface is greater than the contact area at the sub-package/heat spreading component interface. Such an arrangement can relax the impact of the thermal contact resistance at the heat sink interface as a result of the increased contact area with the heat sink. Furthermore, the interface attachment between the sub-package and the heat spreading component may be designed so as to lower the thermal contact resistance of that interface. In some embodiments, the contact area at heat spreading component/heat sink interface is about 2 times greater (e.g., 4 times greater, 6 times greater, 12 times greater) than the contact area at the sub-package/heat spreading component interface.

The heat spreading component may generally be made of any suitable material having suitable thermal properties (e.g., thermal conductivity). In some embodiments, the heat spreading component may be made of a material having a relatively high thermal conductivity, for example, a thermal conductivity greater than 80 W/mK. For example, suitable materials include metals such as copper and/or aluminum. In some embodiments, copper heat spreading components are particularly preferred. In other embodiments, the heat spreading component may comprise non-metals having a sufficiently high thermal conductivity including materials such as diamond and/or silicon carbide. Composites (e.g., aluminum diamond, aluminum silicon carbide) may also be used including composites that may be molded to form suitable shapes.

It should be understood that the heat spreading component may have any suitable shape and dimensions. In some cases, the heat spreading component is substantially planar (e.g., a plate), though non-planar components are also possible. In some cases, it may be preferable for the heat spreading component to be relatively thick compared to the light-emitting die thickness. In some embodiments, the ratio of the thickness of the heat spreading component to the light-emitting die thickness may be greater than 2, greater than 3, greater than 4, or greater than 6. In some cases, the thickness of the heat spreading component may be greater than 1 mm, greater than 3 mm, greater than 5 mm, greater than 1 cm, or greater than 2 cm.

The heat spreading component need not be a completely solid component, and can include hollow portions. Such hollow portions may facilitate heat removal from the heat spreading component. For example, the heat spreading component can include holes or cavities that can enable fluid (e.g., air, liquid) to be in contact with a larger surface area of the heat spreading component, thereby potentially improving heat transfer from the heat spreading component to the surrounding ambient. Such holes or cavities may extend through a portion of the interior of the heat spreading component, may extend through the entire interior of the heat spreading component, or may be arranged in any other suitable configuration. In some cases, the holes or cavities can extend from one surface region of the heat spreading component to another surface region of the heat spreading component.

The heat spreading component may also include one or more surface regions that are not smooth and which can increase the contact area with the surrounding ambient as compared to a smooth surface, thereby aiding in the transfer of heat to the ambient. In some embodiments, one or more sides of the heat spreading component include features (e.g., grooves, fins, spikes) which may be patterned onto the surface and which can increase the contact area with the surrounding ambient as compared to a smooth surface. In some cases, features (e.g., grooves) may extend vertically and/or horizontally along the sides of the heat spreading component. Also, in some instances, features (e.g., grooves) may extend vertically and horizontally along the sides of the heat spreading component and may form spikes.

The die/sub-package and sub-package/heat spreading component contact interfaces can be suitably engineered. Suitable attachment material used to attach adjacent materials at the interfaces can include solder (e.g., an alloy between two or more metals such as gold, germanium, tin, indium, lead, silver, molybdenum, palladium, antimony, zinc, etc.), metal-filled epoxy, thermally conductive adhesives (such as those offered by Diemat, Inc. of Byfield, Mass.), metallic tape, thermal grease, and/or carbon nanotube-based foams or thin films. The attachment material typically has a suitable thermal conductivity and therefore a suitable thermal resistance per unit contact area. For example, an attachment material layer (e.g., between the heat spreading component and the heat sink) may have a thermal resistance per unit area of greater than $10°$ C. $mm^2/W$ (e.g., greater than $20°$ C. $mm^2/W$, greater than $40°$ C. $mm^2/W$). In some embodiments, for example when using a solder material (e.g., low melting temperature solder) at one or more interfaces, lower processing temperatures may be preferred.

Patterning and/or controlled roughening may be incorporated at one or more interfaces. For example, patterning the sub-package back side and/or either side of the heat spreading component can facilitate sub-package and/or heat sink attachment. Release channels may be formed to enable the escape of air pockets or bubbles that may form at an interface during the attachment process. Alternatively or additionally, patterning can provide control over pressure points during the attachment process.

Attaching the heat spreading component and the heat sink can be accomplished with the attachment materials noted above. In some embodiments, the tolerance for coverage and uniformity of the attachment may be somewhat relaxed. For example, between 10% and 50% voiding may be tolerable for a solder attachment at the interface between the heat spreading component and the heat sink. In such a context, voiding refers to areas of discontinuity in the attachment material, usually caused by air gaps or bubbles. The voiding may be measured using any suitable technique, for example ultrasonic imaging of the attachment interface.

Any suitable external heat sink may be used. The heat sink can include passive and/or active heat exchanging mechanisms, as the invention is not limited in this respect. Passive heat sinks can include structures formed of one or more materials that conduct heat as a result of temperature differences in the structure. Passive heat sinks may also include protrusions (e.g., fins, combs, spikes, etc.) which can increase the surface contact area with the surrounding ambient and therefore facilitate heat exchange with the ambient. For example, a passive heat sink may include a copper slug core, which provides a thermally conductive material that can conduct thermal energy to surrounding aluminum fins radiating out from the copper slug. In a further embodiment, a passive heat sink may also include channels in which fluid (e.g., liquid and/or gas) may flow so as to aid in heat extraction via convection within the fluid. For example, in one embodiment, the heat sink may comprise a heat pipe to facilitate heat removal. Suitable heat pipes are available from such vendors as Lightstream Photonics and Furukawa America, but it should be understood that the embodiments presented herein are not limited to merely such examples of heat pipes. Heat pipes can be designed to have any suitable shape, and are not necessarily limited to only cylindrical shapes. Other heat pipe shapes may include rectangular shapes which may have any desired dimensions.

Active heat sinks may include one or more suitable means that can further aid in the extraction of heat. Such active heat sinks can include mechanical, electrical, chemical and/or any other suitable means to facilitate the exchange of heat. In one embodiment, an active heat sink may include a fan used to circulate air and therefore cool the heat sink. In another embodiment, a pump may be used to circulate a fluid (e.g., liquid, gas) within channels in the heat sink. In further embodiments, the heat sink may be connected to a thermal electric cooler that may further facilitate heat extraction from the heat sink. In other embodiments, the heat sink can include the thermal electric cooler, or may consist solely of a thermal electric cooler.

In further embodiments, a light-emitting device having a heat spreading component need not be attached to an external heat sink. In such embodiments, the heat spreading component may be sufficient to conduct heat to the surrounding ambient.

In some embodiments, the heat spreading component may comprise one or more heat pipes. The heat pipes may have any suitable shape and dimensions. The one or more heat pipes may be arranged such that one end (i.e., the heat absorbing end) of the heat pipes is located underneath the sub-package and potentially in contact with the sub-package, or alternatively, in contact with thermal vias that may be in contact with the sub-package. The other end of the heat pipes (i.e., the cooling end) may be exposed to the ambient. The heat pipes may contain fins or protrusions at the cooling end of the pipe to aid in heat exchange. The heat pipes may be aligned parallel and/or perpendicular to the sub-package back side. Since the heat pipes may have a thermal conductivity that is larger than the thermal conductivity of many metals (e.g., copper), the conduction of heat may be improved via the incorporation of the heat pipes into the heat spreading component.

Figure 2:
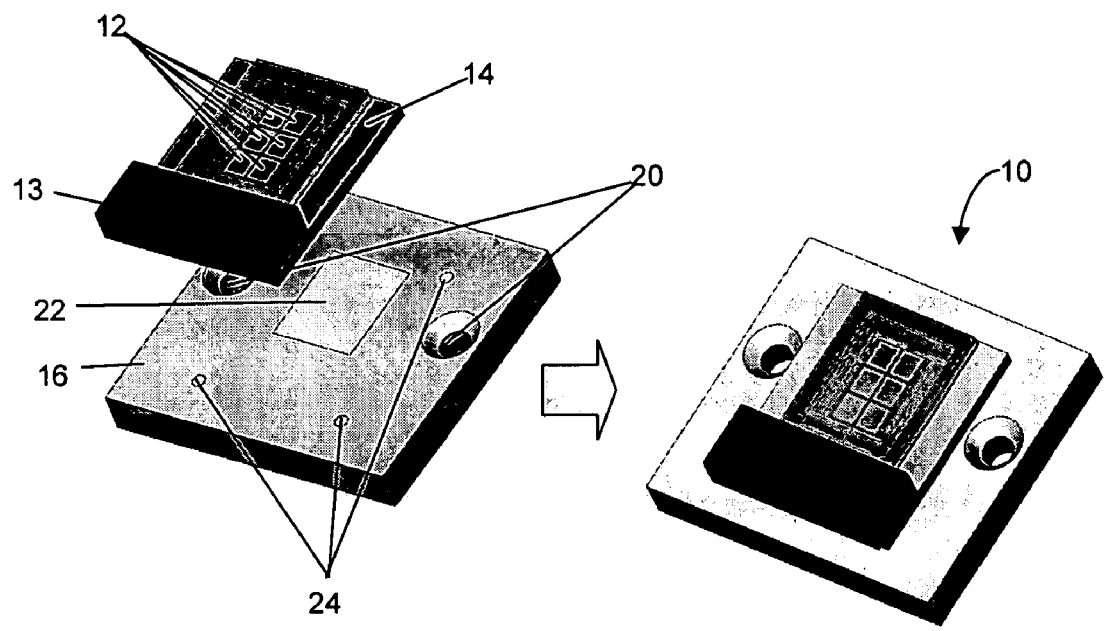
FIG. 2 shows the attachment of a light-emitting die subpackage to a heat spreading component according to one embodiment of the invention.

FIG. 2 shows an attachment of light-emitting device sub-package 14 to heat spreading component 16 so as to form light-emitting device 10 according to one embodiment of the invention. The sub-package includes a connector 13 that can enable electrical connection with the light-emitting die 12 housed within the sub-package 14.

In the illustrated embodiment, the heat spreading component is a plate having square dimensions, but any shape may be employed, as the invention is not limited in this respect. In the illustrated embodiment, the plate includes holes 20 for screw attachment, but alternatively or additionally, clips may be used to secure the light-emitting device 10. The heat spreading component may include a pad 22 which may be a solder pad for the attachment of the sub-package to the heat spreading component. Alignment markers 24 may be provided to facilitate the sub-package attachment process.

Figure 3:
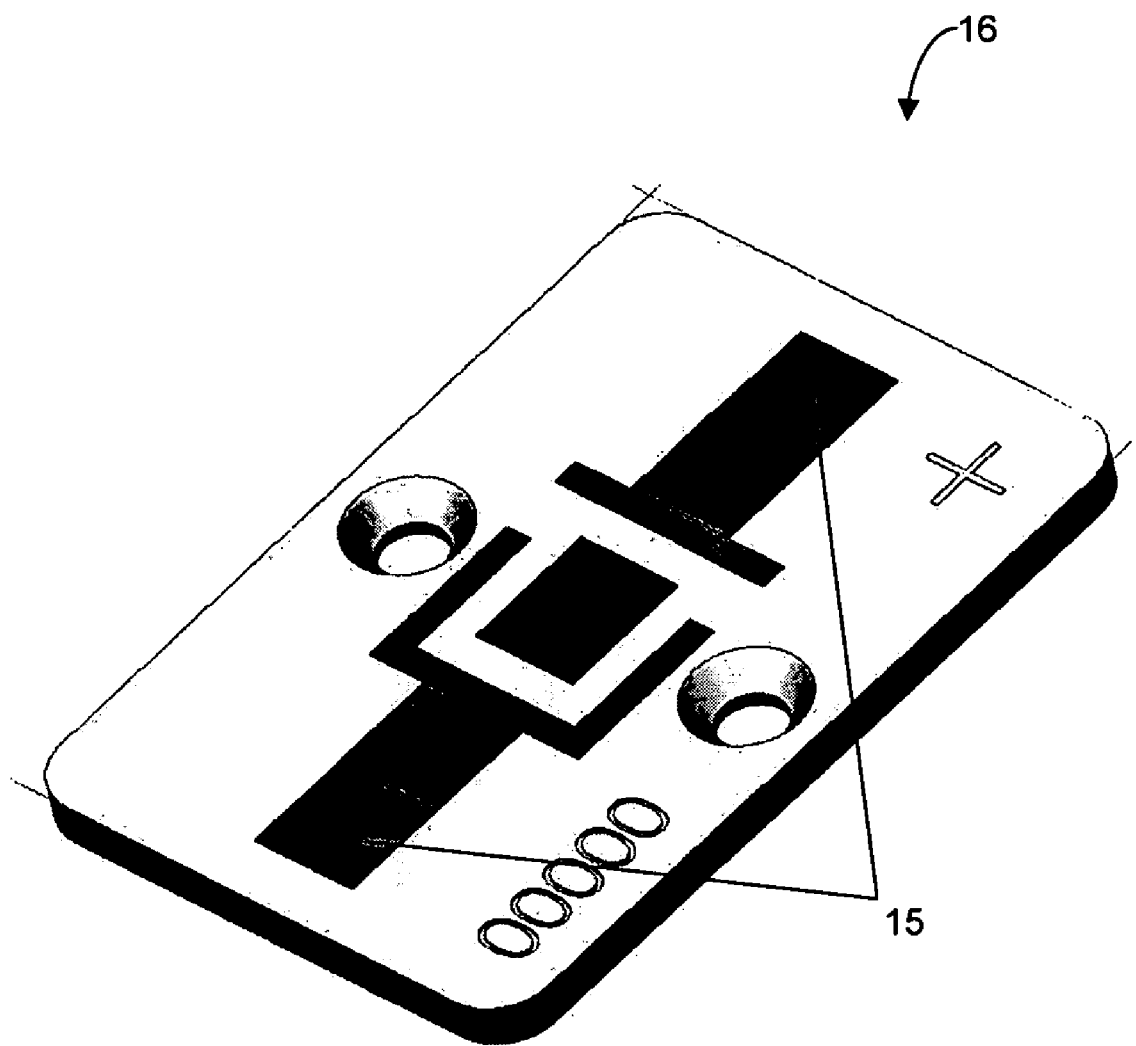
FIG. 3 shows a metal plate heat spreading component according to one embodiment of the invention.

FIG. 3 shows a heat spreading component 16 according to another embodiment of the invention. In this embodiment, the heat spreading component is a plate (e.g., formed of copper or aluminum) coated with a non-conducting material (i.e., dielectric or polymer) and including electrically conducting leads 15 which may be electrically coupled to the light-emitting device sub-package upon assembly.

Figure 4A:
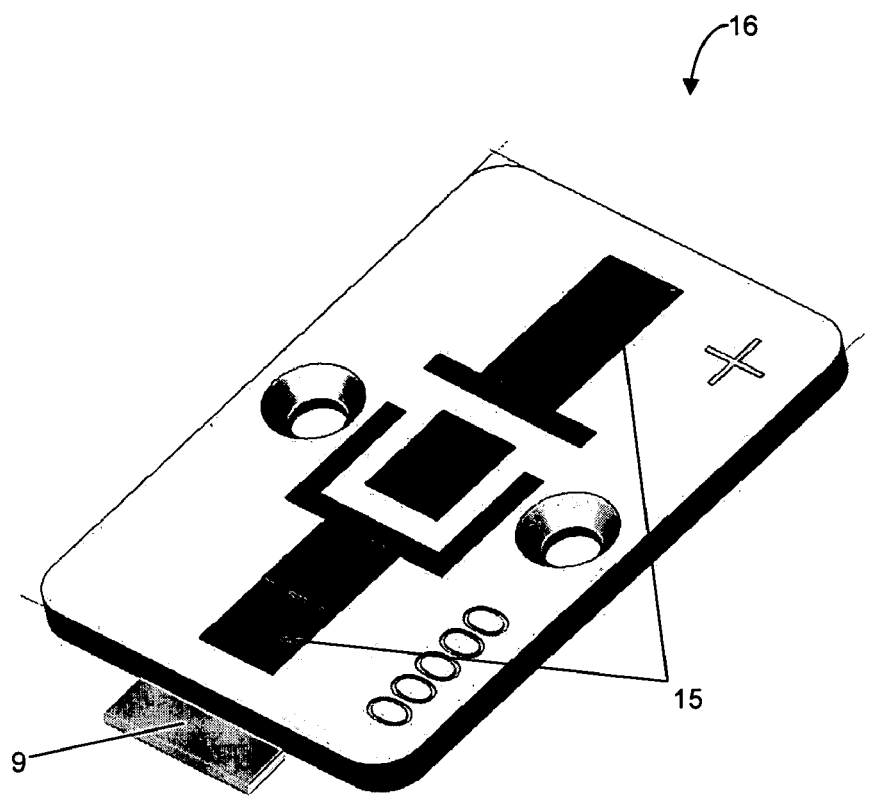
FIG. 4a shows a heat spreading component according to one embodiment of the invention.
Figure 4B:
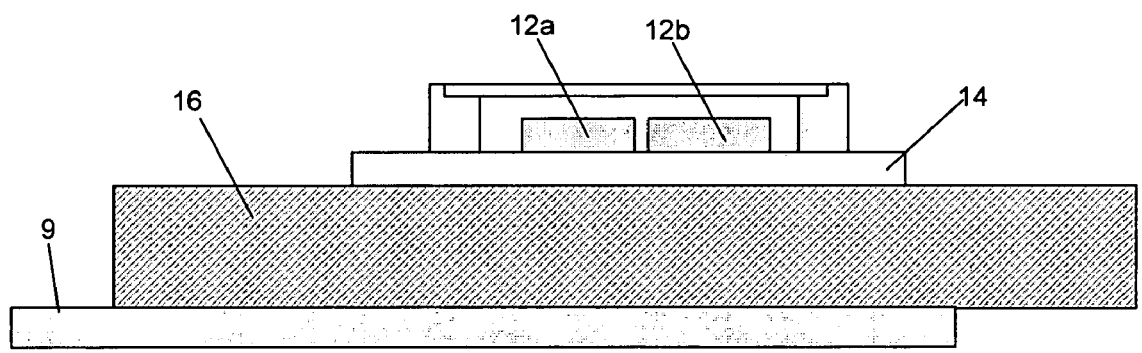

FIGS. 4a and 4b show a perspective view and cross-section view of a heat spreading component 16 in contact with a heat pipe 9, according to another embodiment of the invention. In the illustrated embodiment, the heat spreading component is a plate (e.g., formed of copper or aluminum) similar to that shown in FIG. 3, and the heat spreading component 16 is in contact with one or more heat pipe(s) 9. In other embodiments, heat pipe(s) can embedded within the heat spreading component so that the heat absorbing end of the heat pipe(s) resides underneath the sub-package 14 and the cooling end may be exposed to the ambient. In the illustration, the heat pipe has a rectangular tape-like shape, but it should be appreciated that any other shape is possible.

Other embodiments and variations to the illustrated structures also fall under the scope of this invention. For example, one or more die may be directly bonded to the heat spreading component. In such embodiments, the surface of the heat spreading component may be electrically insulating (e.g., coated with a dielectric layer) and can include the desired electrical leads to facilitate electrical connections to the light-emitting die. Additionally, the heat spreading component may also include thermal vias located underneath the die.

Calculations have been performed to predict junction temperature with and without a 3 mm-thick copper plate heat spreading component for a 2×3 LED array attached to an external heat sink. The array size is 3.9 mm×6.6 mm and each LED size is 1.9 mm×2.1 mm. In addition, the sub-package substrate to which the LED die are attached is 1 mm-thick and formed of aluminum nitride. In the case where there is no copper plate heat spreading component and the thermal conductivity of the heat sink attach interface is 4 W/mK, the junction temperature is predicted to be between 120-150° C. The low heat sink attach conductivity can correspond to a carefree assembly to the heat sink, wherein, for example, the attachment may include a significant number of voids and/or the attachment material may have a substantially low thermal conductivity. In the presence of a copper plate heat spreading component between the sub-package and the heat sink, the junction temperature is lowered by 20° C. for the same heat sink attach conductivity. In the later case, the sub-package/heat spreading component interface thermal conductivity is assumed to be 25 W/mK. These calculations were performed for a 3 mm-thick copper plate heat spreading component. Decreasing the heat spreading component thickness to 1.5 mm increases the junction temperature by 5° C. Increasing the heat spreading component thickness beyond 3 mm further lowers the junction temperature as seen by the thermal resistance results illustrated in the simulation results presented in FIG. 5.

Figure 5:
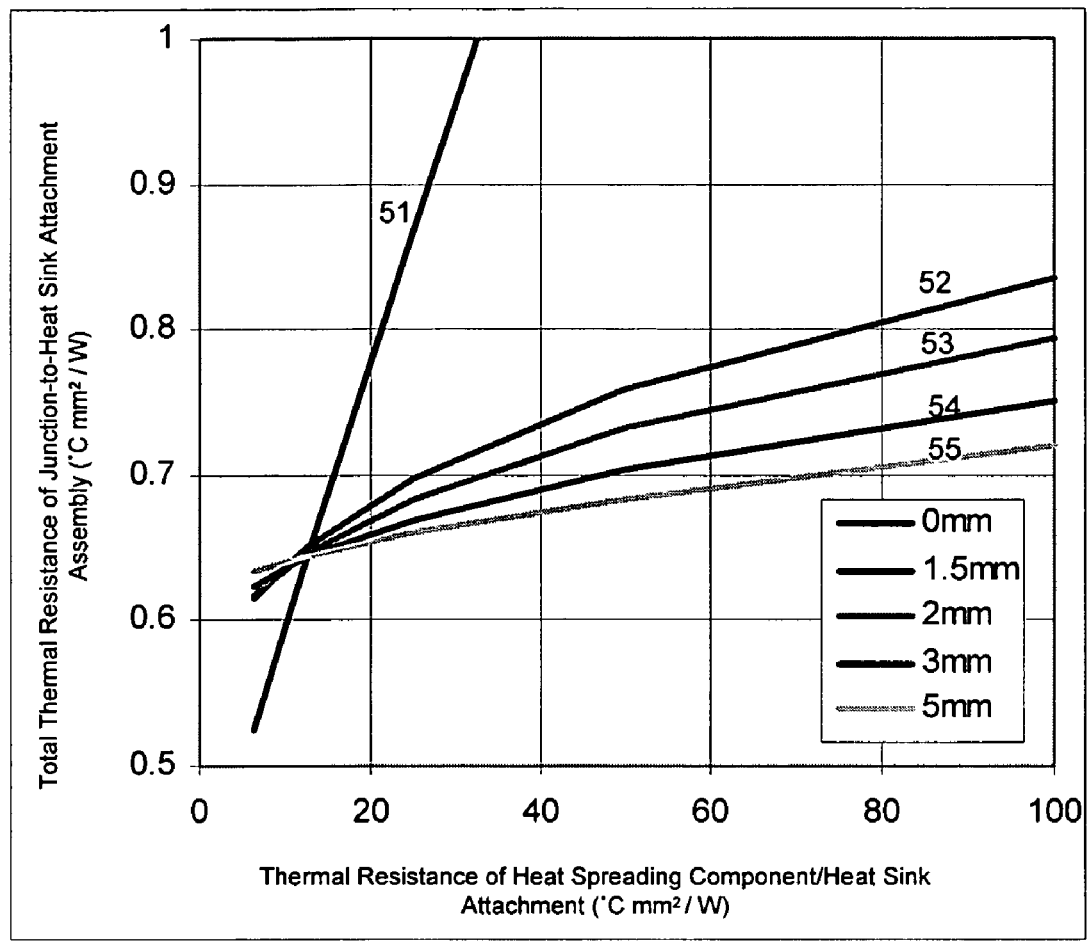
FIG. 5 shows simulation results for a light-emitting device similar to that shown in FIG. 1.

FIG. 5 shows the results of calculations estimating the thermal resistance of the junction to heat sink attachment (i.e., essentially the total thermal resistance of the entire light-emitting device and the heat sink) as a function of the thermal resistance per unit area of the heat spreading component/heat sink attachment. The thermal resistance per unit area of the heat spreading component/heat sink attachment is characteristic of the quality of the attachment between the heat spreading component and the heat sink, and will generally be larger for attachments that have more voids. The resistance of the attachment may also depend on the thermal resistivity of the attachment material, which may include solder, thermal grease, or thermally conductive adhesives. Therefore, a larger thermal resistance for this interface corresponds to a poorer attachment having a larger number of voids and/or to an attachment formed with a material having a low thermal conductivity. The various data curves 51-55 correspond to different thicknesses for a copper plate heat spreading component. Curve 51 corresponds to a case where no heat spreading component is present and the sub-package is directly attached to the heat sink. Curve 52, 53, 54, and 55 correspond to cases where a 1.5 mm, 2 mm, 3 mm, and 5 mm thick copper plate heat spreading component is present, respectively.

Based on the calculation results, the 5 mm thick copper plate heat spreading component can allow for larger process latitude with respect to variations in the thermal resistance of the heat spreading component/heat sink interface. The smaller slope of curve 55 implies that, in the case of a 5 mm thick copper plate heat spreading component, the total thermal resistance of the light-emitting device varies gradually with the quality of the attachment between the heat spreading component and the heat sink. It is anticipated that variations in the total thermal resistance versus variations in the thermal resistance of the heat spreading component/heat sink attachment would be even less pronounced as the heat spreading component's thickness increases beyond 5 mm. In some embodiments, an upper limit on the thickness of the heat spreading component may be imposed by a desired flatness of the heat spreading component and/or by a desired package size.

As previously mentioned, a light-emitting device may include a package that can facilitate the use of the light-emitting device in components and systems. Suitable packages may facilitate the removal of heat and the use of light-emitting devices in components and systems such as light-emitting panel assemblies, LCD back lighting, LCD edge lighting, general lighting, decorative or display lighting, automotive lighting, projection lighting and other types of lighting systems. For example, the light-emitting device package can be designed to remove heat in at least a direction perpendicular to a light emission direction of the light-emitting device.

Furthermore, the light-emitting device package may possess one or more features that enable a plurality of light-emitting devices to be coupled mechanically, electrically, and/or thermally. Connection features may serve one or more of the above functions, for example, a connection feature may serve to both couple the device mechanically and electrically.

Figure 6A:
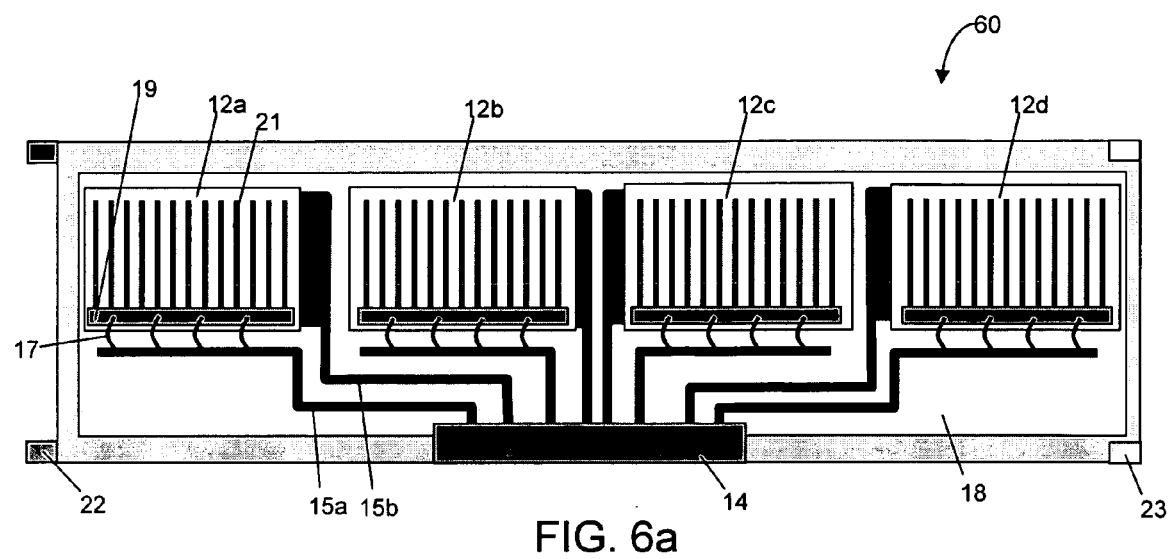
FIG. 6a is a top view of a light-emitting device according to one embodiment of the invention.

FIG. 6a shows a top view of a light-emitting device 60 according to one embodiment of the invention. The light-emitting device includes a series of light-emitting die 12a-d that are arranged linearly in the illustration presented. However, it should be understood that other die arrangements are also possible. In some embodiments, the linear arrangement may be advantageous for illumination into a thin panel (e.g., an illumination panel, an LCD panel). The die can have the same or different light emission wavelengths. In some embodiments, the die can emit different colored light so as to form white light. For example, in the embodiment illustrated, two die can emit green light, one die can emit red light, and one die can emit blue light.

As shown, the die can be electrically connected to an electrical connector 14. The electrical connections may be made via electrically conducting leads 15a and 15b formed on a laminated circuit board 18. Electrical connections to top-contact pads 19 on the die may be made with bond wires (e.g., gold wires) 17 connecting leads 15a to the top-contact pads 19 on the die. The top-contact pads 19 on the die can be electrically connected to electrically conductive fingers 21 which can enable electrical current to spread throughout the entire die surface. Electrical connections to the backside of the die may be made with a backside contact with lead 15b. In some cases, respective connections (e.g., leads 15) to the die may be electrically isolated from one another. In some cases, electrical connections may be formed with compliant connectors, instead of, or in addition to, wire bonds. It should be understood that the die may be connected in parallel or in series. In the illustrative embodiment show in FIG. 6a, light is emitted from the die in a direction out of the plane of figure.

The leads 15a and 15b are also connected to the electrical connector 14 (e.g., a pin connector), so as to provide an electrical connection between the die and the electrical connector 14. It should be appreciated that connector 14 may be placed at any suitable location, including at the top, bottom, or any side of the light-emitting device. The placement of the connector 14 may be chosen so as to facilitate the use of the light-emitting device in desired components and systems.

Packaged light-emitting device 60 includes a base 20 on which the die 12a-d are mounted. The base may be formed of a thermally conductive material such as metal(s) and composite(s) (e.g., copper, aluminum, aluminum-diamond composite, aluminum-silicon carbide composite). The base may function as a heat sink to aid in the removal of heat from the light-emitting device. The base (or other parts of the package) may be designed to include additional features that can promote heat removal. For example, the features may facilitate lateral conduction of heat (i.e., in a direction perpendicular to the light emission direction), though it is also possible for the light-emitting device to include features that facilitate vertical conduction of heat (i.e., in a direction parallel to the light emission direction).

Figure 6B:
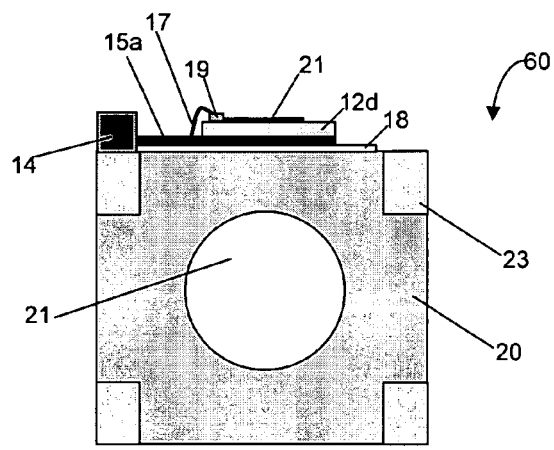
FIG. 6b is a cross-section of a base of the package of the light-emitting device of FIG. 6a including a cooling channel.

A feature that may facilitate the removal of heat is a channel 21 in the base 20, as shown in FIG. 6b illustrating one embodiment of the invention. During use, fluid (e.g., air, liquid) may flow through the channel and aid in heat exchange and cooling. In general, the channel may have any suitable dimensions and shape. In some embodiments, the channel may be shaped to increase the contact area between the fluid and the base so as to enhance heat transfer and therefore cooling. Alternatively, or additionally, the channel interior may have a patterned, grooved, finned, and/or spiked surface which can increase the contact area as compared to a smooth channel interior. Furthermore, the light-emitting device base may include more than one channel. In some embodiments, it may be preferable for the base to be relatively large to enhance heat transfer with the surrounding ambient.

It should be understood that other suitable features for promoting heat removal may be used. For example, in one embodiment, the light-emitting device may be thermally coupled to a finned heat sink design which may be used in connection with a cooling fan. It should also be understood that the heat removal features may be positioned in locations other than the base of the light-emitting device.

In some embodiments, the light-emitting device may include one or more heat pipe(s) that can facilitate heat removal. The heat pipe(s) may be located at any suitable location on the light-emitting device, and have a suitable configuration which may be tailored for the use of the light-emitting device in specific components and systems. In one embodiment, one end of the heat pipe(s) may be in contact with any portion of the base 20, and the other end of the heat pipe may be exposed to the surrounding ambient so as to facilitate in the transfer of heat out of the light-emitting device. In one embodiment, one or more heat pipe(s) may be inserted into the channel 21, and one end of the heat pipe(s) may be arranged to be underneath the die 12a-d and the other end may be exposed to the surrounding ambient.

The light-emitting device can have one or more features that allow multiple light-emitting devices to be connected. The features may also allow the connected light-emitting devices to be interlocked. The features can be such that the connected light-emitting devices are aligned in a desired manner. For example, the light emission surfaces of the connected light-emitting devices may be aligned so as to lie on substantially the same plane. Alternatively, the emission surfaces of the connected light-emitting devices may be arranged so that the emission surfaces are not on the same plane. In general, the emission surfaces may be parallel or arranged so that the emission directions of each light-emitting device are not all the same. Such arrangements may be desirable for lighting applications that require light to be emitted from multiple directions rather than just one direction.

In the illustrative embodiment of FIGS. 6a and 6b, the light-emitting device includes protrusions 22 (e.g., tabs) and depressions 23, but it should be appreciated that this is just one example of features that may be used to enable the connection of multiple light-emitting devices. The protrusion and depression can enable connection to additional light-emitting devices to form a light-emitting module having a larger total light emission area, with each light-emitting device being a separate element of the larger light-emitting module. For example, the protrusions may engage with corresponding depressions on the other light-emitting device so as to form a light-emitting module. In some embodiments, the light-emitting module formed by the connection of two or more light-emitting devices forms a mechanically rigid assembly. Protrusions and depressions may also align the individual light-emitting devices in the light-emitting module, for example, in the lateral direction. Such alignment can allow the emission surfaces of multiple light-emitting devices to lie substantially on the same plane or on parallel planes.

The light-emitting device 60 can have dimensions suitable for a desired application. In some cases, the dimensions and/or shape of the base 20 can be chosen so as to meet desired specifications. For example, the base 20 illustrated in FIGS. 6a and 6b can have a length of about 28 mm, a width of about 8 mm, and a depth of about 6 mm. It should be appreciated that this is just one example of possible dimensions for the light-emitting device base, and other dimensions and shapes are possible.

In some embodiments, the light emission surface of the light-emitting device 60 can be covered in any suitable manner. For example, a transparent window and/or encapsulant material may be disposed over light-emitting die, and thereby provide protection for the die and any electrical connections.

Figure 7A:
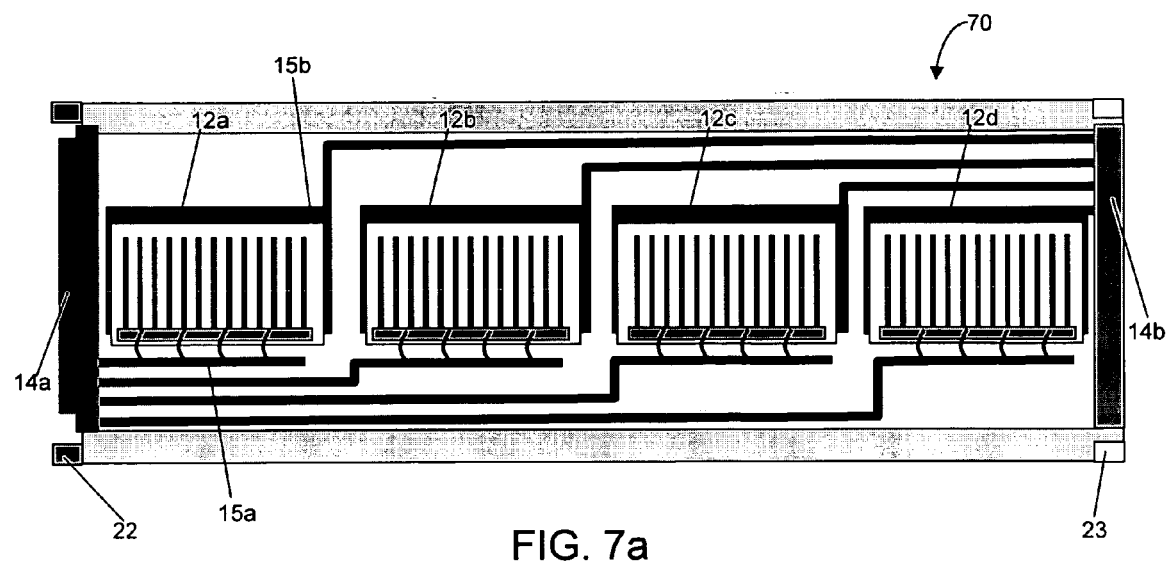
FIG. 7a is a top view of a light-emitting device according to one embodiment of the invention.
Figure 7B:
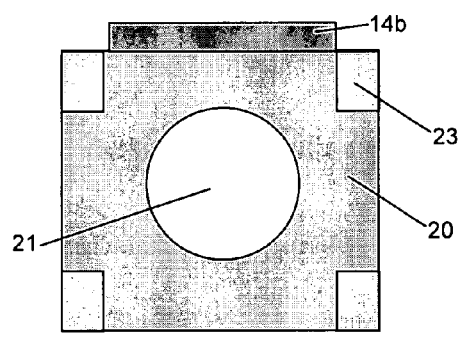
FIG. 7b is a cross-section of a base of the package of the light-emitting device of FIG. 7a including a cooling channel.

FIG. 7a is a top view of a light-emitting device 70 according to another embodiment of the invention. FIG. 7b is a cross-section of the light-emitting device of FIG. 7a including a cooling channel. This embodiment is similar to the light-emitting device illustrated in FIG. 6, except that the leads 15a and 15b contacting the top and bottom sides of the light-emitting die 1 2a-d have been arranged so as to be electrically coupled to a male electrical connector 14a and a female electrical connector 14b, respectively. Such an arrangement can facilitate electrical coupling between other components (e.g., packaged light-emitting devices, packaged control circuits, packaged sensing components, packaged passive electrical connectors) having compatible electrical connectors. Furthermore, other connection features (e.g., protrusions 22 and depressions 23) can facilitate the mechanical connection of multiple components (e.g., packaged light-emitting devices, packaged control circuits, packaged sensing components, packaged passive electrical connectors), thereby enabling a user to modularly couple multiple components and create a customized light-emitting module. The connection features (e.g., protrusions 22 and depressions 23) can also serve to align the light emission surfaces of the connected light-emitting devices. In some embodiments, the electrical connectors can also serve to provide the desired mechanical (and/or thermal) connection between multiple components. In some embodiments, the mechanical connection between multiple components forms a mechanically rigid assembly.

Figure 8:
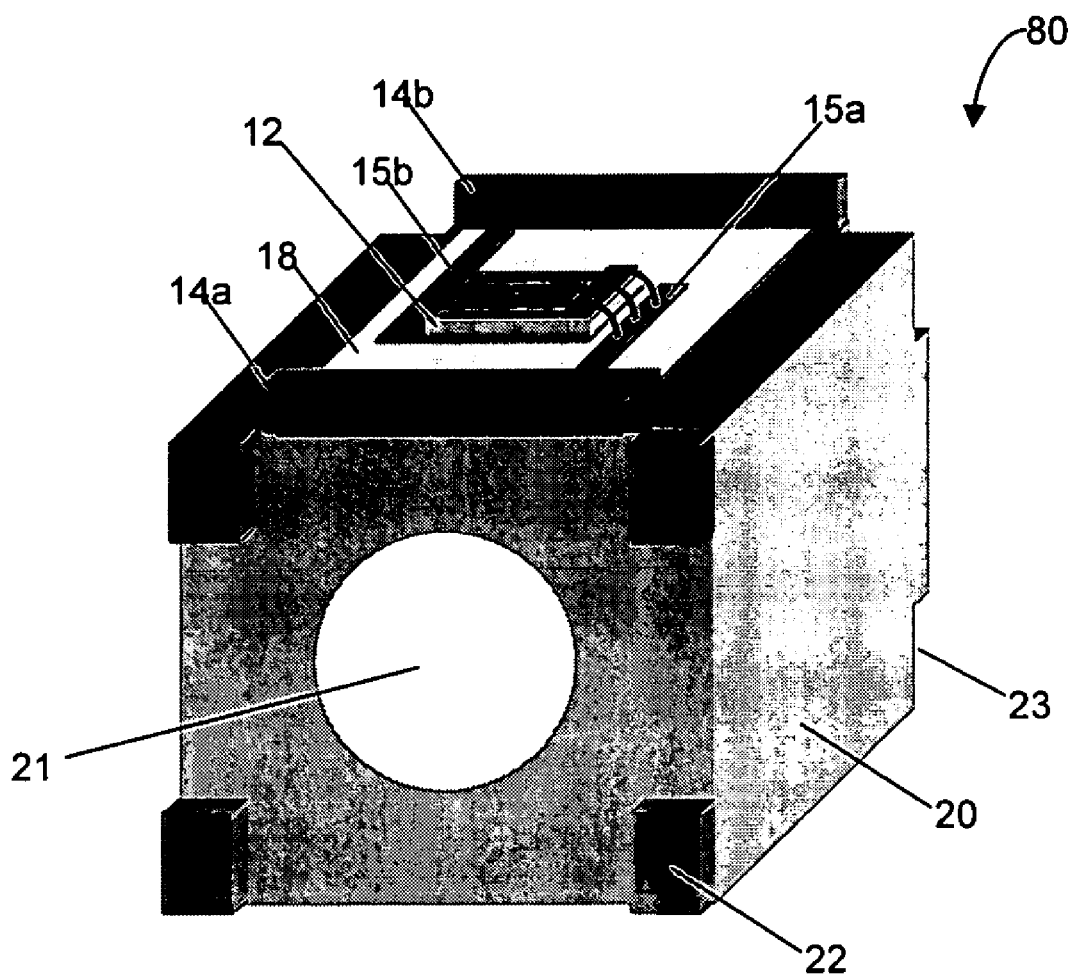
FIG. 8 is a perspective view of a light-emitting device according to one embodiment of the invention.

FIG. 8 is a perspective view of a light-emitting device 80 according to one embodiment of the invention. The illustrated light-emitting device is similar to the embodiments shown in FIGS. 7a and 7b, except that only one light-emitting die is shown, but it should be appreciated that any number of die may be used. The male electrical connector 14a and the female electrical connector 14b facilitate electrical coupling to the light-emitting die. Furthermore, the male electrical connector 14a and the female electrical connector 14b are arranged to enable other light-emitting devices and other components to be readily coupled to form a customized light-emitting module.

Figure 9:
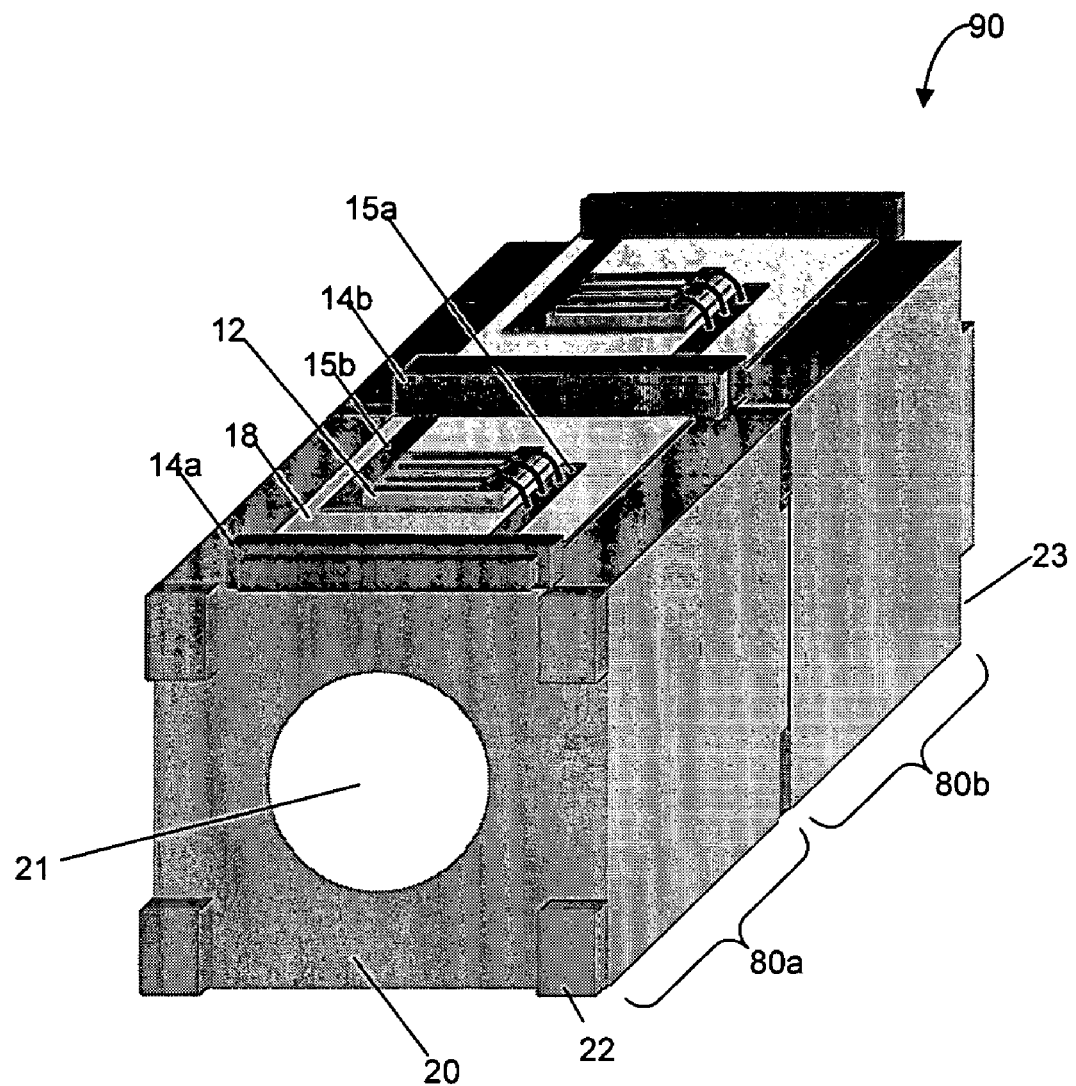
FIG. 9 is a perspective view of a light-emitting module including engaged light-emitting devices according to one embodiment of the invention.

FIG. 9 is a perspective view of a light-emitting module 90 including engaged light-emitting devices 80a and 80b, according to one embodiment of the invention. The light-emitting devices can be mechanically connected using the protrusions and depressions, but it should be appreciated that any other suitable features may be employed to accomplish mechanical connection. For example, the mechanical connection features can be a rectangular ridge on one end of the light-emitting device base and a corresponding rectangular groove on the other end. In some embodiments, the light-emitting module 90 may form a mechanically rigid assembly. Electrical connectors 14a and 14b may also perform other functions other than providing electrical coupling to the light emitting die. For example, the light-emitting devices may be coupled mechanically and/or thermally via the coupling of male and female electrical connectors.

The engaged light-emitting devices shown in light-emitting module of FIG. 9 may be arranged so as to facilitate the thermal coupling of the devices, and thereby facilitate heat transfer laterally (i.e., parallel to the light emission surface) along the light-emitting module 90. For example, the bases of the light-emitting devices may be in direct contact, which can enable heat transfer from one device to another. Alternatively, or additionally, features for removing heat may also be coupled. For example, a channel 21 in the bases of the light-emitting devices may be aligned so as to enable fluid (e.g., air, liquid) to flow from one light-emitting device to another.

Although the illustration of FIG. 9 shows a light-emitting module 90 having only two connected light-emitting devices, any number of light-emitting devices may be connected. The resulting light-emitting module formed by coupling the desired number of light-emitting devices can therefore be customized so as to have the desired light emission color and brightness, via the selection of light-emitting device components having the desired combination of emission wavelength (s) and the desired total brightness. Furthermore, the light-emitting module formed by connecting the light-emitting devices need not only have a linear arrangement, and can such that the connected light-emitting devices form any desired shape or arrangement.

A light-emitting module may in turn be incorporated into any assembly, thereby forming a light-emitting module assembly, although it should be appreciated that a light-emitting module assembly need not necessarily include anything else other than the light-emitting module. In some cases, the light-emitting module assembly may include other components, such as an illumination panel, supporting structures, and/or any other component.

Figure 10:
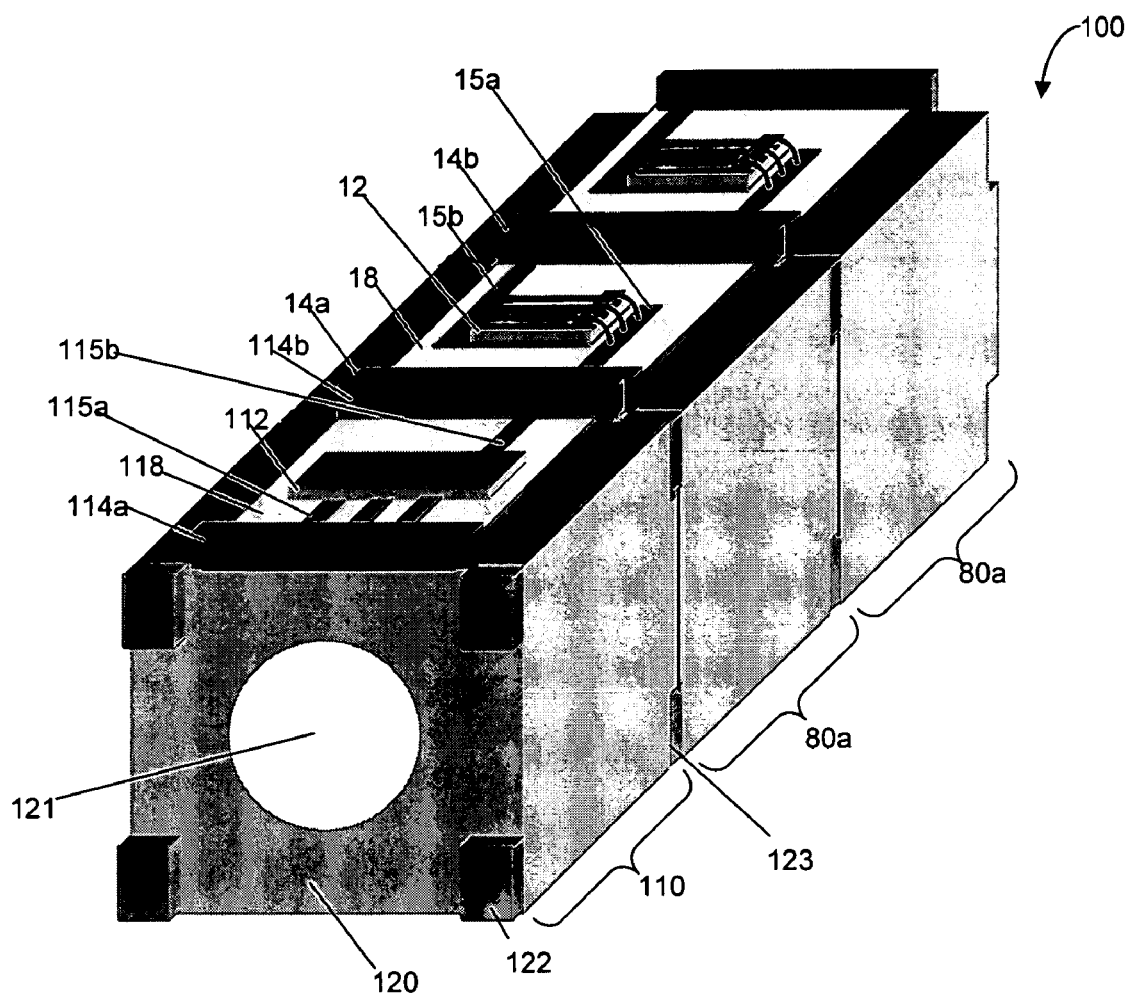
FIG. 10 is a perspective view of a light-emitting module including engaged light-emitting devices and an engaged control and/or power device component according to one embodiment of the invention.

FIG. 10 is a perspective view of a light-emitting module 100 including engaged light-emitting devices 80a and 80b and an engaged power and/or control device component 110, according to one embodiment of the invention. The power and/or control device component 110 includes power and/or control circuitry on die or chip(s) 112 which are disposed over a laminated circuit board 118. The power and/or control circuits on the one or more die or chip(s) 112 are connected to male electrical connector 114a and female electrical connector 114b via leads 115a and 115b, respectively. The power and/or control device component 110 may include a base 120, a channel 121, and/or mechanical connection features (e.g., protrusions 122 and depression 123), which may be similar to the corresponding elements on the package of the light-emitting devices, as described previously.

Although the illustrated embodiment shows an engaged power and/or control device component, it should be understood that any number of other components may be included in the light-emitting module, at either end of, and/or in-between, the light-emitting devices. Such elements can include passive electrical connection components, control circuit components, power supply components, sensing components, and/or diagnostic components. Such components can also be used when a module only includes a single light-emitting device.

The ability to remove heat from the light-emitting device can lead to a number of advantages. For example, heat removal can enable operation at high power levels (e.g., light-emitting devices having a total output power of greater than 0.5 Watts). High power devices benefit from efficient heat removal in order to prevent premature aging and/or breakdown of the device from excessive heating. Heat removal may also enable on-board control features (e.g., color sensing and control, performance diagnostics, current control).

The light-emitting devices may be used in a variety of applications including LCD lighting and solid-state lighting. For example, the light-emitting devices may be used in LCD panel applications (as described further below), general panel lighting (e.g., flat panels, shaped panels, flexible panels, molded panels), as well as automotive signal lights (e.g., rear or front end panel lights).

Figure 11A:
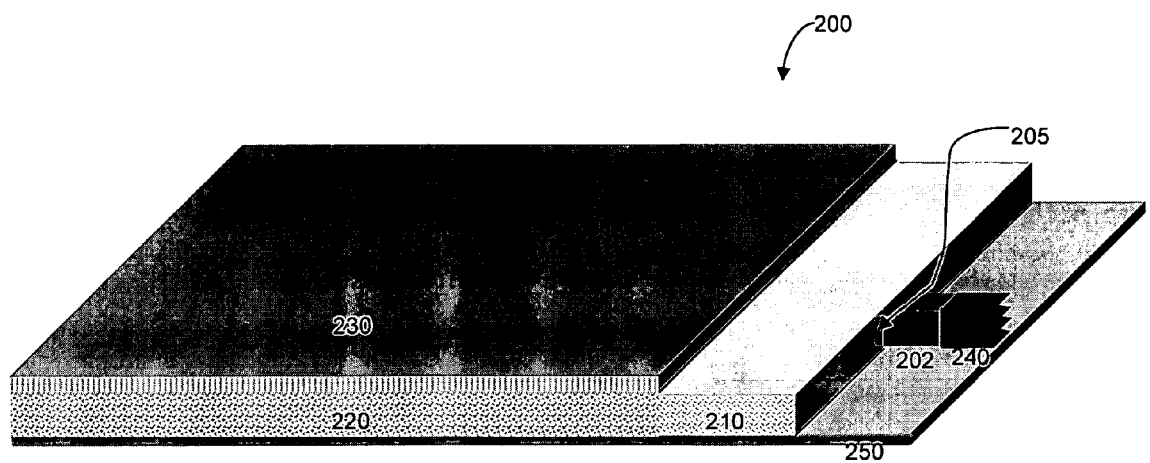
FIG. 11a is a perspective view of a light-emitting panel assembly including a light-emitting device according to another embodiment of the invention.
Figure 11B:
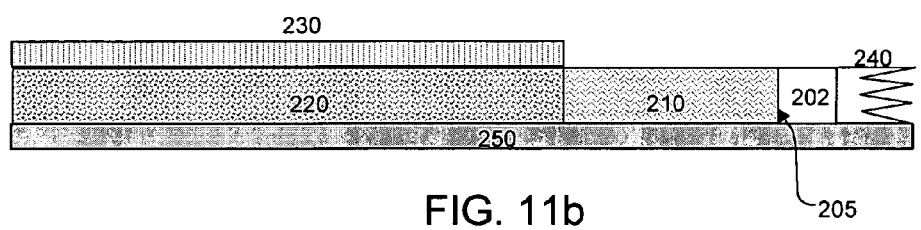

FIG. 11 a (perspective view) and 11b (side view) shows an embodiment where a light-emitting panel assembly 200 includes a light-emitting device (or module) 202. When a light-emitting module is used, the light-emitting panel assembly is an example of a light-emitting module assembly.

It should be understood that although only a single light-emitting device is shown in the figure, light-emitting panel assembly 200 typically includes a number of light-emitting devices (which may be connected as discussed above, and thereby can form a light-emitting module). In the illustrated embodiment, the light-emitting device(s) are used for edge illumination of the panel. A topside 205 of light-emitting device 202 is oriented so that light is emitted into homogenizer 210. In some cases, the light-emitting device may be directly attached to the homogenizer via continuous encapsulation. The homogenizer can mix the light emitted from light-emitting die in a given package and from multiple packages in a light-emitting module. Light can then be directed into illumination panel 220. Illumination panel 220 may include scattering centers that can direct light evenly into LCD layers 230. LCD layers 230 can pixilate and separate light into colors so as to create images which may be viewed by a user. In other embodiments, LCD layers 230 may be absent and the light-emitting panel assembly may be used for general illumination or any other suitable purpose.

Packaged light-emitting device (or module) 202 may be similar to any one of the light-emitting devices or modules shown previously, though other light-emitting devices or module designs are also possible. In the illustrated embodiment, a finned heat sink 240 can be thermally coupled to, or be part of, the light-emitting device (or module) package, but it should be understood that the heat sink is an optional feature.

A support (e.g., a back-plate) 250 is in thermal contact with the light-emitting device package 202 and can additionally act as a heat sink for light-emitting device (or module) 202. That is, the support may remove heat generated within the light-emitting device or module. In some embodiments, it may be advantageous to prevent heat generated in the light-emitting device or module from spreading into the homogenizer and illumination panel so as to avoid heating and possible premature aging of the light panel elements. To this effect, a thermally insulating layer of material (such as Teflon) can be applied between illumination panel 220 and support 250, and/or between homogenizer 210 and support 250, if desired. In some cases, an air gap or thermal barrier is located between the surface of the support and the illumination panel and/or homogenizer so as to prevent heat conduction to undesired regions. Additionally, or alternatively, the panel can be sectioned into thermally conductive and non-conductive materials (i.e., thermally conductive under light-emitting device 202 but not thermally conductive under illumination panel 220). The support may also contain a reflective layer to help guide light propagating in panel 220 towards the emission surface (e.g., towards LCD layers 230). Typical materials that may form the support include aluminum, aluminum alloys, steel, or combinations thereof.

Figure 12:
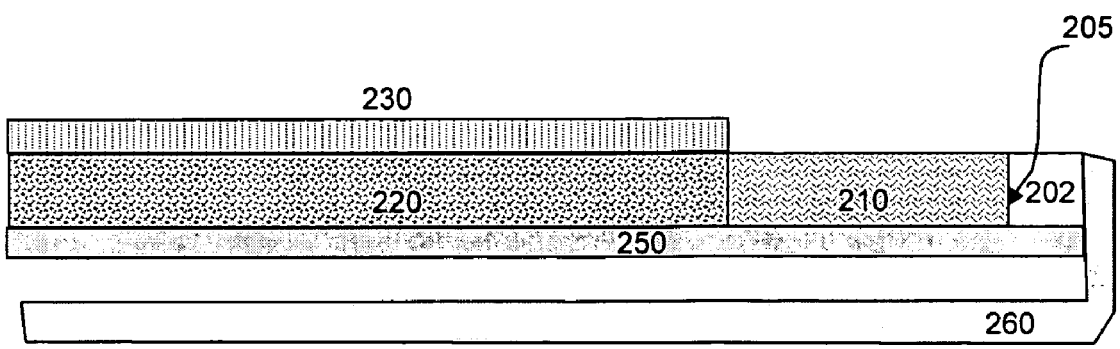
FIG. 12 is a cross-section of light-emitting panel assembly including a heat pipe.

In some embodiments, a heat pipe may be attached to the light-emitting device package to facilitate heat removal. FIG. 12 shows a cross-section of an embodiment which incorporates light-emitting device 202 and heat pipe 260 into an light panel for edge illumination. The heat pipe can be attached to support 250 or it can be spaced away from the support in order to facilitate heat removal with the ambient. The heat pipe is not limited to configurations wherein the heat pipe wraps around the backside of the light panel. In one embodiment, the heat pipe could be incorporated around the edges of the panel and/or integrated with a frame encasing the edges of the panel. The heat pipe may contain fins or protrusions at the cooling end of the pipe to aid in heat exchange.

One or more heat pipes may be used per light-emitting device. In one embodiment where the light-emitting device contains an array of red, green, and blue LEDs, a separate heat pipe can be used to extract heat in the vicinity of the red LED. In some embodiments, the operation of blue and green LEDs may be less sensitive to high operating temperatures, and therefore can share a heat pipe.

In some embodiments, the light-emitting device or module 202 has dimensions that facilitate the incorporation of the device or module 202 into a system, such as an illumination panel. In some cases, the light-emitting device or module 202 has a thickness that is about the same as the thickness of the element that the emitted light from the light-emitting device or module is directed into. For example, in the illustration of FIGS. 11 and 12, the light-emitting device or module 202 has the same thickness as the homogenizer and/or illumination panel.

In some embodiments, the ability to remove heat from the light-emitting device can enable operation at high power levels (e.g., light-emitting devices having a total output power of greater than 0.5 Watts), as previously described. Due to potential for the high output power light emission (i.e., high brightness) from the light-emitting devices, the number of light-emitting devices that are used per unit length of the illumination panel may be reduced. In one embodiment, a high brightness light-emitting device can be used to edge illuminate an illumination panel length of about 2 inches or greater (e.g., greater than 4 inches, greater than 6 inches). In some such embodiments, the high brightness light-emitting device has an emission power of greater than about 0.5 W and may comprise a red light-emitting die, a blue light emitting die, and a green light-emitting die.

As previously noted, the light-emitting devices and modules presented can be used in systems other than illuminations panels and LCD displays. In any such system, the light-emitting devices and/or modules may have features that facilitate the incorporation of the light-emitting devices and/or modules into the system. The light-emitting devices and/or modules can have one or more features that facilitate electrical, thermal, and/or mechanical coupling to the particular system.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A light-emitting panel assembly comprising:
a light-emitting diode having a side from which light is emitted;
a heat pipe in contact with the light-emitting diode including a fluid contained therein, the fluid extracting heat from the light-emitting diode by thermal convection as a result of flow of the fluid through the heat pipe; and
an illumination panel having a side edge adjacent the side of the light-emitting diode from which light is emitted such that light is emitted into the illumination panel via the side edge, the illumination panel propagating the light therein and further including scattering centers that direct the light out of an emission surface of the illumination panel,
wherein the heat pipe extends beneath the emission surface in a direction across the emission surface.

2. The light-emitting panel assembly of claim 1, wherein the heat pipe is arranged to wrap around a backside of the illumination panel.

3. The light-emitting panel assembly of claim 1, wherein the heat pipe is arranged to wrap around at least a portion of an edge of the illumination panel.

4. The light-emitting panel assembly of claim 1, further comprising a second heat pipe in contact with the light-emitting diode and designed to extract heat from the light-emitting device.

5. The light-emitting panel assembly of claim 4, wherein the light-emitting diode comprises a plurality of light-emitting die, wherein the second heat pipe is designed to extract heat in the vicinity of one of the plurality of the light-emitting die.

6. The light-emitting panel assembly of claim 1, wherein the heat pipe extends substantially across the illumination panel.

7. The light-emitting panel assembly of claim 1, further comprising a light-emitting module assembly comprising the light-emitting diode having a first feature and a second light-emitting device having a second feature, wherein the first feature and the second feature are engaged to connect the first light-emitting device and the second light-emitting device.

8. A light-emitting panel assembly comprising:
a light-emitting diode having a side from which light is emitted;
an illumination panel having a side edge adjacent the side of the light-emitting diode from which light is emitted such that light is emitted into the illumination panel via the side edge, the illumination panel propagating the light therein and further including scattering centers that direct the light out of an emission surface of the illumination panel; and a supporting structure constructed and arranged to support the light-emitting diode and the illumination panel, wherein the supporting structure conducts heat generated by the light-emitting diode, and the supporting structure extends beneath the emission surface and substantially across the illumination panel.

9. The light-emitting panel assembly of claim 8, further comprising an LCD layer disposed over the illumination panel.

10. The light-emitting panel assembly of claim 8, wherein the supporting structure and the illumination panel are not in thermal contact.

11. The light-emitting panel assembly of claim 10, wherein a thermally insulating layer is disposed between the supporting structure and the illumination panel such that the supporting structure and the illumination panel are not in thermal contact.

12. The light-emitting panel assembly of claim 8, further comprising an external heat sink constructed and arranged to extract heat from the light-emitting diode.

13. The light-emitting panel assembly of claim 8, wherein at least a portion of the supporting section is substantially parallel to the illumination panel.

14. The light-emitting panel assembly of claim 8, wherein the supporting structure includes a heat pipe associated therewith that extends beneath the emission surface and substantially across the illumination panel.

* * * * *